United States Patent [19]

Yaron et al.

[11] 4,327,477
[45] May 4, 1982

[54] ELECTRON BEAM ANNEALING OF METAL STEP COVERAGE

[75] Inventors: Giora Yaron, Cupertino; Eliyahou Harari, Los Altos; LaVerne D. Hess, Thousand Oaks; Yueh Y. Ma, Mountain View, all of Calif.

[73] Assignee: Hughes Aircraft Co., Culver City, Calif.

[21] Appl. No.: 169,559

[22] Filed: Jul. 17, 1980

[51] Int. Cl.³ ............... H01L 21/263; H01L 21/268; B05D 3/06
[52] U.S. Cl. ............... 29/576 B; 29/571; 148/1.5; 148/187; 357/65; 357/91
[58] Field of Search ............ 148/1.5, 187; 29/571, 29/576 B; 357/65, 91

[56] References Cited

U.S. PATENT DOCUMENTS

| | | | |
|---|---|---|---|
| 3,600,797 | 8/1971 | Bower et al. | 357/91 |
| 3,771,026 | 11/1973 | Asai et al. | 317/234 R |
| 4,059,707 | 11/1977 | Smith et al. | 427/35 |
| 4,116,721 | 9/1978 | Ning et al. | 148/1.5 |
| 4,187,126 | 2/1980 | Radd et al. | 148/1.5 |
| 4,214,918 | 7/1980 | Gat et al. | 148/1.5 |
| 4,229,232 | 10/1980 | Kirkpatrick | 148/1.5 |
| 4,249,960 | 2/1981 | Schnable et al. | 148/1.5 |
| 4,258,078 | 3/1981 | Celler et al. | 427/53.1 |
| 4,267,011 | 3/1981 | Shibata et al. | 156/628 |
| 4,272,880 | 6/1981 | Pashley | 29/571 |

FOREIGN PATENT DOCUMENTS

| | | |
|---|---|---|
| 991846 | 5/1965 | United Kingdom . |
| 1019862 | 2/1966 | United Kingdom . |
| 1333106 | 10/1973 | United Kingdom . |
| 1373490 | 11/1974 | United Kingdom . |
| 2023926 A | 1/1980 | United Kingdom . |

OTHER PUBLICATIONS

Lam et al., in Intn. Electron Devices Meeting, IEEE, Dec. 1979, Washington, D.C., pp. 213–215.
Kamins et al., IEEE Trans. Electron Devices, vol. ED-27, 1980, pp. 290–293.
Greenwald et al., J. Vac. Sci. Technol., 16 (1979), 1838–1839.
Vitali et al., Journ. Appl. Phys. 48 (1977), 815.
Anantha et al., IBM-TDB, 22 (1979), 575–576.
McMahon et al., J. Vac. Sci. Technol. 16 (1979), 1840–1842.
Brodsky et al., IBM-TDB, 22 (1980), 5160–5162.
MaClean et al., J. Phys. D., Appl. Phys. 11 (1978), 999–1007.

*Primary Examiner*—Upendra Roy
*Attorney, Agent, or Firm*—R. M. Wallace; W. H. MacAllister

[57] ABSTRACT

Defects in the metal step coverage of a thin film semiconductor device are removed by annealing the metal layer with a pulsed electron beam.

4 Claims, 3 Drawing Figures

ELECTRON BEAM ANNEALING OF METAL STEP COVERAGE

TECHNICAL FIELD

This invention is useful in semiconductor processes in which a conductive metal film is deposited over the surface of a thin film semiconductor device to form continuous metal conductors.

BACKGROUND ART

Bipolar and field effect transistor integrated microcircuits are formed by a plurality of thin film depositions over a semiconductor substrate. Surface nonuniformities caused by the deposition of numerous thin films having different planar configurations create vertical excursions or steps in the top surface of the thin film device. Conductor buses are formed by first depositing or evaporating metal, such as aluminum, as a thin film on the top surface of the device and then photolithographically defining the conductors. The metal or aluminum lines must cover the vertical steps in the top surface of the device without a loss of continuity. One difficulty with such processes has been that the vertical steps in the top surface of the device cause shadowing effects during the evaporation or deposition of the metal thin film, reducing the thickness of the metal film in the vicinity of the vertical steps, leading to cracks or discontinuities in the metal conductor lines, which is a problem of long standing in the art.

Typically, production yield is significantly reduced by the poor metal step coverage, increasing the cost of producing such devices. One possible solution is to heat the devices so as to reflow, or at least partially reflow, the underlying dielectric film before metal deposition to prevent cracks or discontinuities in the metal layer. The disadvantage of such a solution is that if the device temperature is raised sufficiently to cause the dielectric film matter to at least partially melt, dopant impurities deposited in the underlying semiconductive substrate will significantly redistribute, which may destroy or at least impair the definition of the underlying transistors or devices formed in the substrate. Thus, it has been a long standing goal in the art to prevent discontinuities or cracks in the overlying metal layer without disturbing the electrical properties of the underlying semiconductive substrate.

SUMMARY OF THE INVENTION

In this invention cracks or discontinuities in the overlying metal film are removed after evaporation or deposition of the metal film onto the top surface of the device by bombardment with an electron beam. The energy imparted by the electron beam causes the material in the overlying metal layer to reflow sufficiently to heal any cracks or discontinuities in the metal layer. The pulsed electron beam is applied subsequent to evaporation of the metal layer but before the photolithographic definition of the conductor lines from the metal layer so that the entire top surface of the device is covered by a metal layer during the bombardment or irradiation by the pulsed beam. Preferably, the duration of the pulsed electron beam is sufficiently short so that only the top metal surface is significantly heated so as not to disturb the electrical characteristics of the underlying semiconductor substrate.

DESCRIPTION OF THE FIGURES

The invention is best understood by reference to the accompanying drawings, of which.

DETAILED DESCRIPTION

Figure 1:
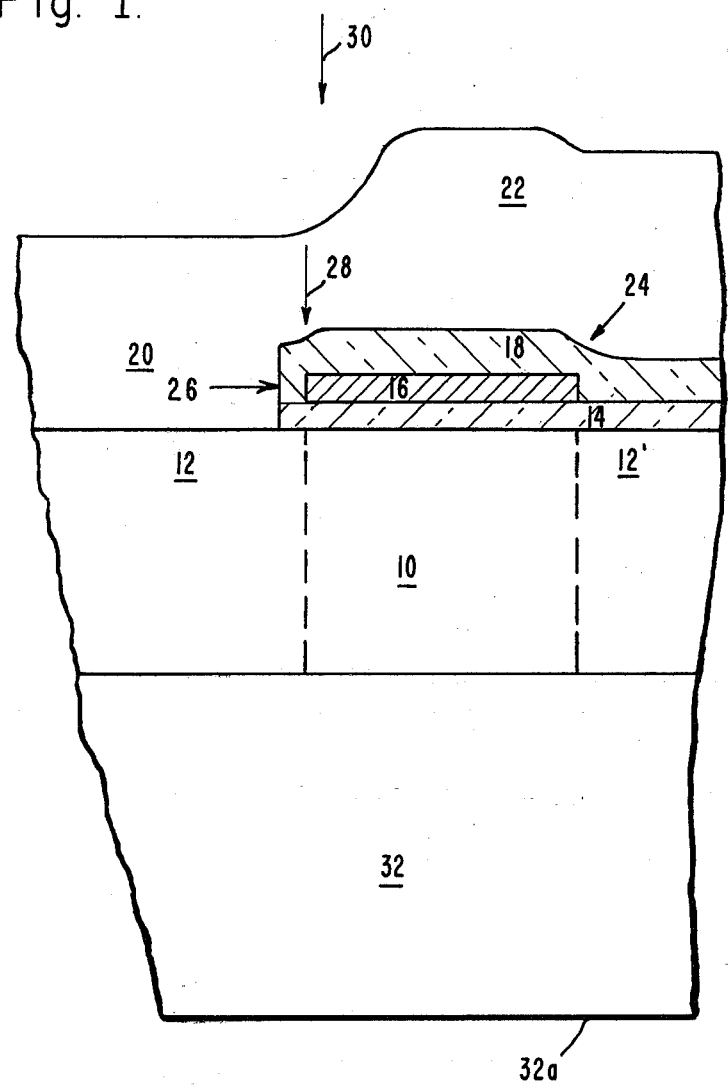
FIG. 1 is a simplified illustration of the method of the invention.

Fabrication of an integrated circuit having either field-effect transistors or bipolar devices usually commences with the fabrication of a semiconductor substrate 10 of a first conductivity type and the formation of doped regions 12 of the opposite conductivity type. Thereafter, various thin films 14, 16, 18 are deposited over the semiconductive substrate. To make a field effect transistor, a thin dielectric film 14 may be placed over the substrate followed by a conductive layer 16 which in turn is covered by another dielectric film 18. Following the deposition or growth of each layer 14, 16, 18, it is individually photolithographically masked and etched to define its planar configuration. Contact holes 20 may be etched through the overlying insulating film 18 to provide electrical connection to the conductive layer 16 or to the doped regions 12. Conductor buses are formed connecting to the conductive layer 16 through the contact holes 20 by evaporating a metal thin film 22 over the top surface of the device and thereafter photolithographically defining metal buses or conductor lines in the layer 22.

Cracks or discontinuities in the metal buses occur because the surface on which the metal film 22 is deposited has many vertical excursions or steps 24, 26 caused by the different planar configurations of each of the underlying thin film layers 14, 16, 18. Such vertical excursions or steps 26 cause shadowing effects during evaporation of the metal thin film, reducing its thickness in the vicinity 28 of each of the vertical steps 26. In each region 28 of reduced thickness, cracks or discontinuities occur in the metal film 22 much too often.

In the present invention, such cracks or discontinuities in metal step coverage are healed or removed after the evaporation or deposition of the metal layer 22 by annealing it with a pulsed electron beam 30. Although this method is equally applicable to semiconductive processes for fabricating either bipolar devices or metal oxide semiconductor devices, the invention was actually used in a metal oxide semiconductor silicon on sapphire (MOS/SOS) process as follows:

(1) Define silicon islands 10 over a sapphire substrate 32.

(2) Form source and drain regions 12 in each silicon island 10.

(3) Form a dielectric gate oxide layer 14.

(4) Form polysilicon gates or electrodes 16 overlying the channel region between each source and drain 12.

(5) Form an overlying dielectric film 18.

(6) Open contact holes 20 to the sources and drains 12 and other contact holes (not shown) to the polysilicon electrodes 16 through the overlying insulating layers 14, 18.

(7) Evaporate aluminum metal 22 over the entire device.

(8) Expose the aluminum layer 22 to a pulsed electron beam 30 using an SPI 6,000 Pulsed Electron Beam Apparatus manufactured by Spire Corporation, Bedford, Massachusetts, which is controlled by an internal discharge capacitor, the electron beam 30 having a pulse duration of 20 nanoseconds, a beam diameter of approximately 1 ½ inches and wherein the discharge capacitor of the electron beam apparatus is initially charged to approximately 190 kilovolts.

(9) Photolithographically define conductor lines or buses from the overlying aluminum layer 22.

The best results are obtained when the thickness of the thin oxide layer 14 is 500 angstroms, the thickness of the polysilicon layer 16 is 5,000 angstroms, the thickness of the overlying insulating layer 18 is approximately 9,000 angstroms and the thickness of the evaporated aluminum layer 22 is 1 micron. It should be noted that the illustration of FIG. 1 is not to scale with respect to the thickness of the various layers.

It was found necessary to cover the entire back surface 32a of the substrate 32 with a conductive substance or liquid and then provide firm contact between the entire back surface 32a and the anode of the electron beam apparatus so that electrons impinging on the aluminum layer 22 may be rapidly conducted away from the aluminum layer 22 to the anode in order to prevent excessive charge build-up in the aluminum 22. It was observed that, if good conduction is not provided between the back surface 32a and the anode of the electron beam apparatus, field-induced stress failure of the aluminum 22 occurs because of the electron charge build-up in the aluminum 22 during the electron beam exposure. Although the method of this invention was first successfully carried out by using a conductive grease between the back surface of the substrate and the electron beam device anode, it is anticipated that more desirable conductive fluids or substances compatible with current semiconductor processes may be employed to perform the same function.

While not subscribing to any particular theory, it is believed that the 20 nanosecond pulse duration of the electron beam 30 is sufficiently short with respect to thermal conduction times of the silicon substrate 10, so that even though sufficient heat is imparted to the overlying aluminum layer 22 to at least partially melt the aluminum, the heat rapidly dissipates before the underlying silicon substrate 10 can be significantly heated. As a result, the electrical characteristics of semi-conductive devices formed in the underlying silicon substrate are not significantly changed (for example, by thermally induced diffusion of dopant impurities defining the sources and drains 12).

It is also believed that the experiment above-described raised the temperature of the aluminum 22 to almost precisely its melting temperature. It was observed that if a more powerful electron beam is employed, a portion of the metal film 22 is evaporated while if a less powerful electron beam is employed, the aluminum material does not reflow sufficiently to heal the cracks or discontinuities.

Figure 2:
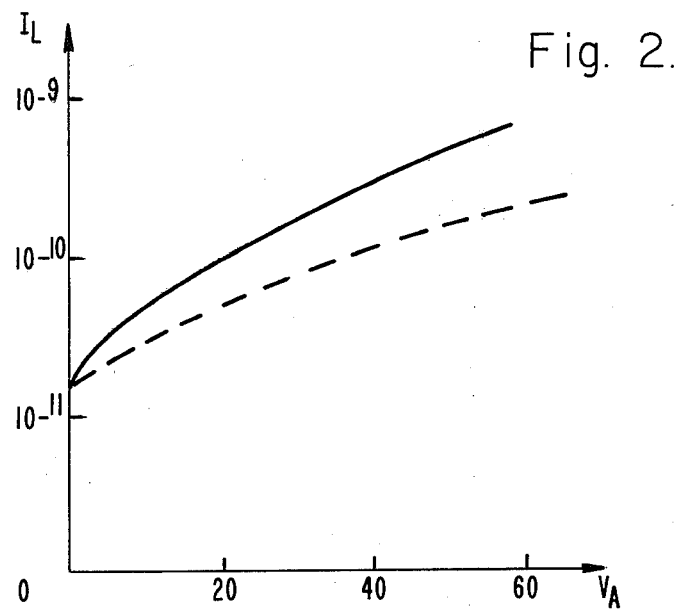
FIG. 2 is a comparative plot of the leakage current through an insulating layer in semiconductor devices formed with and without the method of the invention.

One unexpected advantage of the invention is that the leakage current between the overlying metal layer 22 and the silicon substrate 10 is significantly reduced following exposure of the aluminum 22 to the electron beam 30. Referring to FIG. 2, the leakage current $I_L$ between the overlying aluminum layer 22 and the underlying silicon substrate 10 as a function of applied voltage $V_A$ between the layers 10 and 22 is plotted in which the solid line corresponds to an aluminum layer unexposed to an electron beam while the dashed line corresponds to an aluminum layer having been exposed to an electron beam in the manner of this invention. It is believed that annealing of the aluminum by the electrode beam reduces the density of defects between the aluminum layer 22 and the underlying insulating layer 18, thereby reducing leakage through the insulation 18.

Figure 3:
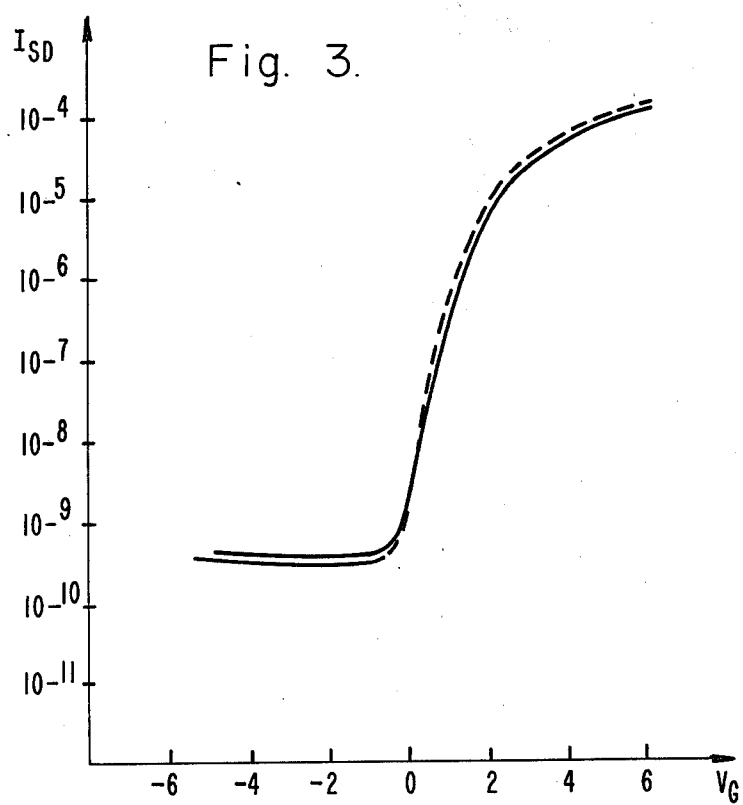
FIG. 3 is a comparative plot of the source to drain current as a function of gate voltage of MOS devices formed with and without the method of the invention.

The main advantage of the invention is that the cracks or discontinuities in the step coverage by the aluminum layer may be removed by welding or reflow of the aluminum material without heating the underlying semiconductive substrate 10 sufficiently to change its electrical characteristics. In prior art attempts to reflow the dielectric film 18 by exposure to an oven or other means, the dopant materials 12 placed in the underlying semiconductor substrate 10 redistributed so as to change the electrical characteristics of the semiconductive devices formed therein, which is an intolerable result avoided in the present invention, as verified by experimental data. Referring to FIG. 3, the source-to-drain current $I_{SD}$ for a MOS/SOS device as a function of applied gate voltage $V_G$ is plotted for two different devices, each of which has an applied drain voltage of 5 volts. The solid line in FIG. 3 corresponds to a MOS/SOS transistor which was fabricated using well-known techniques of the prior art (without attempting to heal cracks in the metal step coverage) while the dashed line curve corresponds to a MOS/SOS transistor fabricated in accordance with the present invention. It will be noted that there is very little difference between the two curves of FIG. 3, indicating that there has been substantially no degradation of electrical characteristics of the underlying semiconductive devices by reason of the exposure to the pulsed electron beam.

While the invention has been described as exposing an evaporated aluminum layer to a pulsed electron beam, the invention may have equal usefulness with other kinds of metal layers and other kinds of energy beams, such as a laser or an ion beam. It should be recognized further that the pulsed beam may be replaced by a continuous beam which is swept across the device at a sufficient rate to allow the metal to reflow without disturbing the underlying semiconductor substrate electrical characteristics.

What is claimed is:

1. A method for making a metal oxide semiconductor silicon-on-sapphire device, comprising the steps of:
    (a) defining silicon islands over a sapphire substrate;
    (b) forming source and drain pairs in each of said silicon islands;
    (c) forming a dielectric gate oxide layer covering the channel region between each of said source and drain pairs;
    (d) forming polysilicon gates overlying the channel region between each of said source and drain pairs;
    (e) forming an overlying dielectric film;
    (f) opening contact holes to the polysilicon electrodes and other contact holes to the source and drain pairs;
    (g) evaporating an aluminum layer over the entire device;
    (h) exposing the aluminum layer to a pulsed electron beam using an electron beam apparatus controlled by an internal discharge capacitor, the electron beam having a pulse duration on the order of 20 nanoseconds, a beam diameter on the order of 1 ½ inches and wherein the discharge capacitor of the electron beam apparatus is initially charged to approximately 190 kilovolts; and, (i) photolithographically defining conductor lines in the aluminum layer.

2. A method for making a semiconductor device, comprising the steps of:

(a) forming a semiconductor film over an insulator substrate and defining semiconductor islands in said semiconductor film;

(b) forming source and drain pairs in each of said semiconductor islands;

(c) forming a dielectric gate oxide layer covering the channel region between each of said source and drain pairs;

(d) forming polysilicon gates overlying the channel region between each of said source and drain pairs;

(e) forming an overlying dielectric film;

(f) opening contact holes to the polysilicon electrodes and other contact holes to the source and drain pairs;

(g) evaporating an aluminum layer over the entire device;

(h) exposing the aluminum layer to a pulsed electron beam using an electron beam apparatus controlled by an internal discharge capacitor, the electron beam having a pulse duration on the order of 20 nanoseconds, a beam diameter on the order of 1 ½ inches and wherein the discharge capacitor of the electron beam apparatus is initially charged to approximately 190 kilovolts; and, (i) photolithographically defining conductor lines in the aluminum layer.

3. The method of claim 2 wherein said transistor element forming step comprises forming source and drain regions in said semiconductive layer and forming overlying gate electrodes insulated therefrom by a thin dielectric layer.

4. The method of claim 2 wherein said transistor element forming step comprises doping regions of said semiconductive layer to form source and drain pairs, forming a thin oxide film thereover and forming polysilicon gates over the intervening regions between said source and drain pairs, and wherein said insulating layer forming step comprises forming an insulating layer thereover with contact openings to various ones of said sources, drains and gates.

* * * * *